United States Patent
Azetsuji

(10) Patent No.: US 8,040,165 B2
(45) Date of Patent: Oct. 18, 2011

(54) SEMICONDUCTOR INTEGRATED CIRCUIT

(75) Inventor: Motoshi Azetsuji, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/662,357

(22) Filed: Apr. 13, 2010

(65) Prior Publication Data

US 2010/0271102 A1 Oct. 28, 2010

(30) Foreign Application Priority Data

Apr. 28, 2009 (JP) ................................. 2009-108688

(51) Int. Cl.
*H03B 1/00* (2006.01)

(52) U.S. Cl. .......................... 327/112; 327/134; 327/170

(58) Field of Classification Search .................. 327/108, 327/111–112, 170, 132, 134; 326/82–87
See application file for complete search history.

(56) References Cited

U.S. PATENT DOCUMENTS

| | | | |
|---|---|---|---|
| 6,281,715 B1 * | 8/2001 | DeClue et al. | 327/65 |
| 6,356,141 B1 * | 3/2002 | Yamauchi | 327/543 |
| 7,279,942 B2 * | 10/2007 | Otani et al. | 327/112 |

FOREIGN PATENT DOCUMENTS

JP 2003-309460 10/2003

\* cited by examiner

*Primary Examiner* — An Luu

(74) *Attorney, Agent, or Firm* — McGinn Intellectual Property Law Group, PLLC

(57) ABSTRACT

Provided is a semiconductor integrated circuit including: a differential driver that is disposed between a first power supply and a second power supply and drives differential input signals to generate differential output signals; and a control signal generation circuit that generates a first control signal for controlling a voltage level of each of the differential output signals. When each of a pair of output signals forming the differential output signals is changed from a voltage level corresponding to the first power supply to a voltage level corresponding to the second power supply, an amount of change in the voltage level of the corresponding output signal is controlled based on the first power supply.

19 Claims, 4 Drawing Sheets

SEMICONDUCTOR INTEGRATED CIRCUIT

INCORPORATION BY REFERENCE

This application is based upon and claims the benefit of priority from Japanese patent application No. 2009-108688, filed on Apr. 28, 2009, the disclosure of which is incorporated herein in its entirety by reference.

BACKGROUND

1. Field of the Invention

The present invention relates to a semiconductor integrated circuit, and more particularly, to a driver circuit including a slew rate control circuit.

2. Description of Related Art

USB (Universal Serial Bus) interfaces are used with a wide range of peripheral devices. Examples of standard peripheral devices using USB interfaces include a mouse, a keyboard, a disk drive, a printer, and audio/video equipment.

In order to transfer highly reliable information through a USB interface, it is important to improve the quality of the waveform of signals to be transmitted to and received from a transceiver. When communications are conducted at full speed and low speed, for example, even if a power supply voltage for driving the transceiver fluctuates in a range of 3.0 V to 3.6 V, a voltage level at which a pair of differential output signals to be transmitted and received cross each other (hereinafter, referred to as "crossover voltage") is required to meet specifications in a range of 1.3 V to 2.0 V.

FIG. 5 is a circuit configuration diagram showing a differential driver 4 and a constant current source TD for driving the differential driver 4, which is disclosed in Japanese Unexamined Patent Application Publication No. 2003-309460. The constant current source TD includes a constant current circuit TD1 and constant current transistors TrD1 to TrD4. The differential driver 4 includes drivers 4a and 4b. The drivers 4a and 4b output signals with inverted phases. Specifically, the differential driver 4 outputs differential input signals, which are received at input terminals DIN and DINB, as differential output signals from output terminals D+ and D− through the drivers 4a and 4b.

The circuit configuration of the driver 4a provided in the differential driver 4 will now be described. The driver 4a includes transistors MP1 to MP4 which are P-channel MOS transistors, transistors MN1 to MN4 which are N-channel MOS transistors, and capacitors C1 and C2 which are mirror capacitors.

One end of the transistor MP1 is supplied with a power supply voltage VDD. The diode-connected transistor MP2 is disposed between another end of the transistor MP1 and one end of the transistor MN1.

The one end of the transistor MN1 is also connected to the gate of the transistor MP4 and one end of the capacitor C1. A reference potential VSS is applied to another end of the transistor MN1 through the constant current transistor TrD1. Further, the power supply voltage VDD is applied to one end of the transistor MP3 through the constant current transistor TrD2. The diode-connected transistor MN2 is disposed between another end of the transistor MP3 and one end of the transistor MN3.

The another end of the transistor MP3 is also connected to one end of the capacitor C2 and the gate of the transistor MN4. The reference potential VSS is applied to another end of the transistor MN3. The gates of the transistors MP1, MN1, MP3, and MN3 are connected together to receive a single end signal through the input terminal DIN.

The power supply voltage VDD is applied to one end of the transistor MP4. Another end of the transistor MP4 is connected to one end of the transistor MN4, another end of the capacitor C1, and another end of the capacitor C2. The reference potential VSS is applied to another end of the transistor MN4. In this case, the transistor MP4 and the transistor MN4 constitute an output circuit. That is, an output signal from the output circuit corresponds to an output signal of the driver 4a.

As described above, the constant current source TD includes the constant current circuit TD1, which generates a predetermined constant current, and the constant current transistors TrD1 to TrD4. The constant current generated by the constant current circuit TD1 is applied to the gates of the constant current transistors TrD1 to TrD4. Thus, the constant current transistors TrD1 to TrD4 are driven.

As described above, the driver 4a includes the transistors MP1 to MP4, the transistors MN1 to MN4, and the capacitors C1 and C2. Meanwhile, the driver 4b includes transistors MP5 to MP8 which are P-channel MOS transistors, transistors MN5 to MN8 which are N-channel MOS transistors, and capacitors C3 and C4 which are mirror capacitors. The connection configuration of the driver 4b is the same as that of the driver 4a, so the description thereof is omitted.

As shown in FIG. 5, the driver 4a has a circuit configuration including the constant current transistors TrD1 and TrD2. As with the driver 4a, the driver 4b has a circuit configuration including the constant current transistors TrD3 and TrD4.

The constant current circuit TD1 includes transistors MP9, MP10, and MP14 which are P-channel MOS transistors, and a transistor MN9 which is an N-channel MOS transistor. The transistor MP9 and the transistor MP10 constitute a current mirror circuit. The source of the transistor MP9 and the source of the transistor MP10 are each connected to the power supply voltage VDD. The drain of the transistor MP9 is connected to the gate of the transistor MP9, the gate of the transistor MP10, the source of the transistor MP14, the gate of the constant current transistor TrD2, and the gate of the constant current transistor TrD4. The drain of the transistor MP14 is connected to the gate of the transistor MP14, the source of the transistor MN9, and the reference potential VSS. The drain of the transistor MP10 is connected to the drain and gate of the transistor MN9, the gate of the constant current transistor TrD1, and the gate of the constant current transistor TrD3.

An output current of the transistor MP10 is supplied to the transistor MN9. The transistor MP9 forms a current mirror circuit with the constant current transistor TrD2 and the constant current transistor TrD4. The transistor MN9 forms a current mirror circuit with the constant current transistor TrD1 and the constant current transistor TrD3. Thus, a current generated in the constant current circuit TD1 is supplied to the driver 4a and the driver 4b.

In the case of the circuit shown in FIG. 5, however, the crossover voltage of the differential output signals (i.e., output signals from the output terminals D+ and D−) fluctuates depending on the power supply voltage VDD. That is, if the power supply voltage VDD fluctuates for some reason, a fluctuation range of the crossover voltage may not meet the design specifications such as the USB specification. Note that Japanese Unexamined Patent Application Publication No. 2003-309460 fails to disclose a variation in the crossover voltage due to a variation in the power supply voltage VDD.

The reason why the above problem arises will be described below. First, a description is given of the case where an input signal DIN of the driver 4a shown in FIG. 5 changes from H level to L level. It is assumed that a drive current flowing through the constant current transistor TrD2 is denoted by i15 and the feedback capacitance of the capacitor C2 is denoted by C2. In this case, the drive current i15 flows to cause electric charges to be stored in the capacitor C2, thereby controlling a voltage Vdp of an output signal D+. That is, the voltage Vdp can be represented by the following expression (1).

$$Vdp = -(1/C2) \int i15 \, dt \quad (1)$$

Accordingly, the output signal D+ changes from H level to L level.

Next, a description is given of the case where the input signal DIN changes from L level to H level. It is assumed that a drive current flowing through the constant current transistor TrD1 is denoted by i14 and the feedback capacitance of the capacitor C1 is denoted by C1. In this case, the drive current i14 flows to cause the electric charges accumulated in the capacitor C1 to be discharged, thereby controlling the voltage Vdp of the output signal D+. Thus, the output signal D+ changes from L level to H level. Since the driver 4b has the same circuit configuration as the driver 4a, the output signal D+ of the driver 4a has a phase opposite to that of an output signal D− of the driver 4b.

It is assumed herein that the ON-resistance of the transistor MP14 is denoted by RP14 and the gate-source voltage of the transistor MP9 is denoted by Vgs9. In this case, a current i18 flowing between the source and drain of the transistor MP14 can be represented by the following expression (2).

$$i18 = (VDD - Vgs9)/RP14 \quad (2)$$

Note that the current i18 serves as a reference current of the current mirror circuit which is formed of the transistors MP9 and MP10 and the constant current transistors TrD2 and TrD4. Specifically, the current i15 corresponding to the current i18 flows through the constant current transistor TrD2 as a drive current of a predriver 4c. Further, a current i17 corresponding to the current i18 flows through the constant current transistor TrD4 as a drive current of a predriver 4d.

The output current of the transistor MP10 serves as a reference current of the current mirror circuit which is formed of the transistor MN9 and the constant current transistors TrD1 and TrD3. Specifically, the current i14 corresponding to the output current of the transistor MP10 flows through the constant current transistor TrD1 as the drive current of the predriver 4c. Further, a current i16 corresponding the output current of the transistor MP10 flows through the constant current transistor TrD3 as the drive current i16 of the predriver 4d.

In this case, when the power supply voltage VDD is high, the drive currents i14 to i17 increase. That is, the drive currents of the predrivers 4c and 4d increase. As a result, a slew rate (gradient of a signal waveform) of each of the output signals D+ and D− increases. Meanwhile, when the power supply voltage VDD is low, the drive currents i14 to i17 decrease. As a result, the slew rate of each of the output signals D+ and D− decreases.

Assuming that the capacitors C1 to C4, which are provided in the drivers 4a and 4b, the transistors MP1 to MP8, and the transistors MN1 to MN8 have the same characteristics, respectively, and that the drive currents i14 to i17 have the same current value, for example, the rise (rising edge) and fall (falling edge) of the output signal D+ have the same gradient. Similarly, the rise and fall of the output signal D− have the same gradient. This is because the drive currents are supplied through the same current path even when the power supply voltage VDD fluctuates. In this circuit configuration, the crossover voltage is high when the power supply voltage VDD is high, while the crossover voltage is low when the power supply voltage VDD is low. This poses a problem that, if the power supply voltage VDD fluctuates for some reason, the fluctuation range of the crossover voltage may not meet the design specifications such as the USB specification.

SUMMARY

The present inventor has found a problem that the fluctuation range of the crossover voltage increases in the semiconductor integrated circuit of the related art as described above.

A first exemplary aspect of the present invention is a semiconductor integrated circuit including: a differential driver that is disposed between a first power supply and a second power supply and drives differential input signals to generate differential output signals; and a control signal generation circuit that generates a first control signal for controlling a voltage level of each of the differential output signals. When each of a pair of output signals forming the differential output signals is changed from a voltage level corresponding to the first power supply to a voltage level corresponding to the second power supply, an amount of change in the voltage level of the corresponding output signal is controlled based on the first power supply.

The circuit configuration as described above can suppress the fluctuation range of the crossover voltage.

According to the present invention, it is possible to provide a semiconductor integrated circuit capable of suppressing the fluctuation range of the crossover voltage.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EMPLARY EMBODIMENTS

Figure 1:
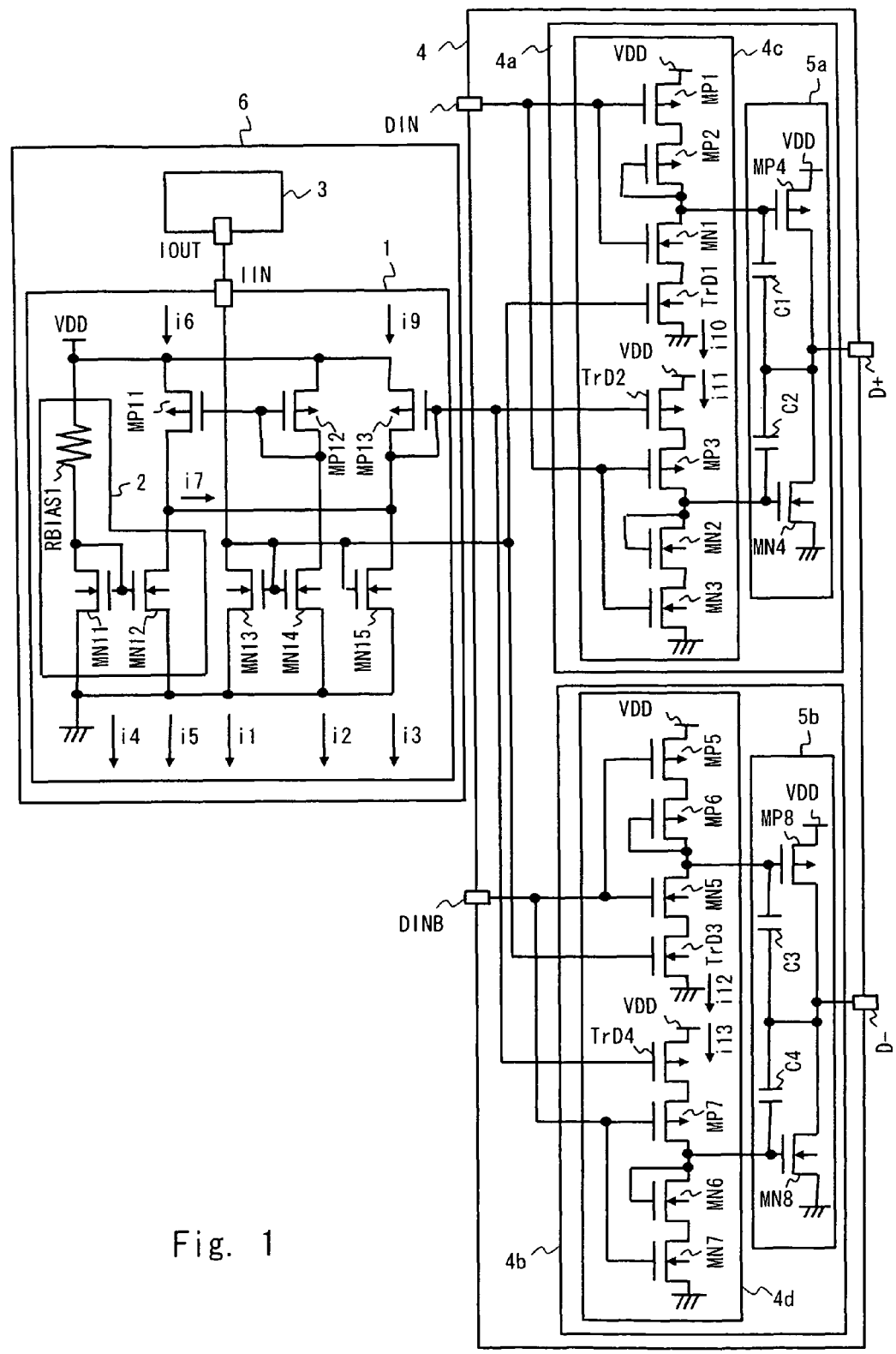
FIG. 1 is a circuit diagram showing a semiconductor integrated circuit according to an exemplary embodiment of the present invention.

An exemplary embodiment of the present invention will be described in detail below with reference to the drawings. Identical components are designated by identical reference numerals throughout the drawings, and duplicative description thereof is omitted as appropriate to clarify the explanation.

First Exemplary Embodiment

A semiconductor integrated circuit according to an exemplary embodiment of the present invention will be described with reference to the drawings. FIG. 1 is a diagram showing the semiconductor integrated circuit according to an exemplary embodiment of the present invention. The circuit shown in FIG. 1 is a differential drive circuit including an output circuit 5a (first output circuit), an output circuit 5b (second output circuit), a predriver 4c (first predriver circuit), a predriver 4d (second predriver circuit), and a control signal generation circuit 6. Each of the output circuits 5a and 5b has an integrator circuit configuration. The predrivers 4c and 4d drive the output circuits 5a and 5b, respectively. The control signal generation circuit 6 controls drive currents.

The circuit shown in FIG. 1 has a feature that a drive current for controlling "rise" (rising edge) of each of output signals D+ and D− is set as a constant current and a drive current for controlling "fall" (falling edge) of each of the output signals D+ and D− is set as a variable current corresponding to a variation in power supply voltage. Specifically, when a power supply voltage VDD (first power supply) is high, a current obtained by adding a current corresponding to the variation in power supply voltage to the constant current is used as the variable current. Meanwhile, when the power supply voltage VDD is low, a current obtained by subtracting a current corresponding to the variation in power supply voltage from the constant current is used as the variable current. Thus, the drive current for controlling the fall of each of the output signals D+ and D− is controlled. By controlling the drive current in this manner, the slew rate (gradient of signal change) at the fall is increased when the power supply voltage VDD is high, and the slew rate at the fall is decreased when the power supply voltage VDD is low. Thus, even when the power supply voltage fluctuates, a fluctuation range of a crossover voltage of differential output signals can be suppressed.

First, the configuration of the circuit shown in FIG. 1 will be described. The circuit shown in FIG. 1 includes a power-supply variation correction circuit 1, a constant current source 3, and a differential driver 4. The power-supply variation correction circuit 1 and the constant current source 3 constitute the control signal generation circuit 6. The power-supply variation correction circuit 1 includes transistors MP11 to MP13, transistors MN11 to MN15, and a resistor RBIAS1. The resistor RBIAS1, the transistor MN11, and the transistor MN12 constitute a variable current source 2.

The differential driver 4 includes drivers 4a and 4b. The driver 4a includes transistors MP1 to MP4 (the transistor MP4 is also referred to as a second transistor), transistors MN1 to MN4 (the transistor MN4 is also referred to as a first transistor), a transistor TrD1 (seventh transistor), a transistor TrD2 (fifth transistor), a capacitor C1 (second capacitive element), and a capacitor C2 (first capacitive element). The transistors MP1 to MP3, the transistors MN1 to MN3, the transistor TrD1, and the transistor TrD2 constitute the predriver 4c. The transistor MP4, the transistor MN4, and the capacitors C1 and C2 constitute the output circuit 5a.

The driver 4b includes transistors MP5 to MP8 (the transistor MP8 is also referred to as a fourth transistor), transistors MN5 to MN8 (the transistor MN8 is also referred to as a third transistor), a transistor TrD3 (eighth transistor), a transistor TrD4 (sixth transistor), a capacitor C3 (fourth capacitive element), and a capacitor C4 (third capacitive element). The transistors MP5 to MP7, the transistors MN5 to MN7, the transistor TrD3, and the transistor TrD4 constitute the predriver 4d. The transistor MP8, the transistor MN8, and the capacitors C3 and C4 constitute the output circuit 5b.

In this exemplary embodiment, a description is given of an example where the transistors MP1 to MP8, the transistors MP11 to MP13, the transistor TrD2, and the transistor TrD4 are P-channel MOS transistors. Further, a description is given of an example where the transistors MN1 to MN8, the transistors MN11 to MN15, the transistor TrD1, and the transistor TrD3 are N-channel MOS transistors.

An output terminal IOUT of the constant current source 3 is connected to an input terminal IIN of the power-supply variation correction circuit 1. The power supply voltage VDD is applied to one terminal of the resistor RBIAS1, the source of the transistor MP11, the source of the transistor MP12, and the source of the transistor MP13. The other terminal of the resistor RBIAS1 is connected to the drain and gate of the transistor MN11 and the gate of the transistor MN12. The drain of the transistor MP11 is connected to the drain of the transistor MN12, the drain of the transistor MN15, the drain and gate of the transistor MP13, and the gates of the constant current transistors TrD2 and TrD4. The drain of the transistor MP12 is connected to the gate of the transistor MP12, the gate of the transistor MP11, and the drain of the transistor MN14.

The input terminal IIN of the power-supply variation correction circuit 1 is connected to the drain and gate of the transistor MN13, the gate of the transistor MN14, the gate of the transistor MN15, and the gates of the constant current transistors TrD1 and TrD3. A reference potential VSS (second power supply) is applied to the source of the transistor MN11, the source of the transistor MN12, the source of the transistor MN13, the source of the transistor MN14, and the source of the transistor MN15.

An input terminal DIN of the differential driver 4 is connected to the gate of the transistor MP1, the gate of the transistor MN1, the gate of the transistor MP3, and the gate of the transistor MN3. An input terminal DINB of the differential driver 4 is connected to the gate of the transistor MP5, the gate of the transistor MN5, the gate of the transistor MP7, and the gate of the transistor MN7. The power supply voltage VDD is applied to the source of the transistor MP1, the source of the transistor TrD2, the source of the transistor MP4, the source of the transistor MP5, the source of the transistor TrD4, and the source of the transistor MP8. The reference potential VSS is applied to the source of the transistor TrD1, the source of the transistor MN3, the source of the transistor MN4, the source of the transistor TrD3, the source of the transistor MN7, and the source of the transistor MN8.

The drain of the transistor MP1 is connected to the drain of the transistor MN1, the gate of the transistor MP4, and one terminal of the capacitor C1 through the diode-connected transistor MP2. The source of the transistor MN1 is connected to the drain of the transistor TrD1. The drain of the transistor MN3 is connected to the drain of the transistor MP3, the gate of the transistor MN4, and one terminal of the capacitor C2 through the diode-connected transistor MN2. The source of the transistor MP3 is connected to the drain of the transistor TrD2.

The drain of the transistor MP4 is connected to the other terminal of the capacitor C1, the other terminal of the capacitor C2, the drain of the transistor MN4, and an output terminal D+ of the differential driver 4.

The drain of the transistor MP5 is connected to the drain of the transistor MN5, the gate of the transistor MP8, and one terminal of the capacitor C3 through the diode-connected transistor MP6. The source of the transistor MN5 is connected to the drain of the transistor TrD3. The drain of the transistor MN7 is connected to the drain of the transistor MP7, the gate of the transistor MN8, and one terminal of the capacitor C4 through the diode-connected transistor MN6. The source of the transistor MP7 is connected to the drain of the transistor TrD4.

The drain of the transistor MP8 is connected to the other terminal of the capacitor C3, the other terminal of the capacitor C4, the drain of the transistor MN8, and an output terminal D− of the differential driver 4.

The differential driver 4 is provided to, for example, a USB transceiver. The differential driver 4 outputs one (input signal DIN) of differential input signals received through the input terminal DIN as one (output signal D+) of differential output signals from the output terminal D+ through the predriver 4c and the output circuit 5a. In the predriver 4c, an inverter (fourth inverter) including the transistors MP1, MP2, and MN1 generates an inverted signal of the input signal DIN, and supplies the inverted signal to the gate of the transistor MP4 as a predrive signal (second predrive signal). An inverter (third inverter) including the transistors MP3, MN2, and MN3 generates an inverted signal of the input signal DIN, and supplies the inverted signal to the gate of the transistor MN4 as a predrive signal (first predrive signal).

Additionally, the differential driver 4 outputs the other (input signal DINB) of the differential input signals received through the input terminal DINB as the other (output signal D−) of the differential output signals from the output terminal D− through the predriver 4d and the output circuit 5b. In the predriver 4d, an inverter (sixth inverter) including the transistors MP5, MP6, and MN5 generates an inverted signal of the input signal DINB, and supplies the inverted signal to the gate of the transistor MP8 as a predrive signal (fourth predrive signal). An inverter (fifth inverter) including the transistors MP7, MN6, and MN7 generates an inverted signal of the input signal DINB, and supplies the inverted signal to the gate of the transistor MN8 as a predrive signal (third predrive signal).

The power-supply variation correction circuit 1 controls currents for driving the predrivers 4c and 4d which are provided in the differential driver 4. In the power-supply variation correction circuit 1, the transistor MN11 and the transistor MN12 constitute a current mirror circuit. The transistor MP11 and the transistor MP12 constitute a current mirror circuit. The transistor MN13, the transistors MN14 and MN15, the constant current transistor TrD1, and the constant current transistor TrD3 also constitute a current mirror circuit. A current corresponding to an output current (source-drain current) of the transistor MN14 flows through the transistor MP12. The transistor MP13, the constant current transistor TrD2, and the constant current transistor TrD4 also constitute a current mirror circuit.

In this case, the current path (drain) of the transistor MP13 is connected to the drain of the transistor MN15, the drain of the transistor MP11, and the drain of the transistor MN12, each of which is disposed on an output side of each current mirror circuit.

Figure 2:
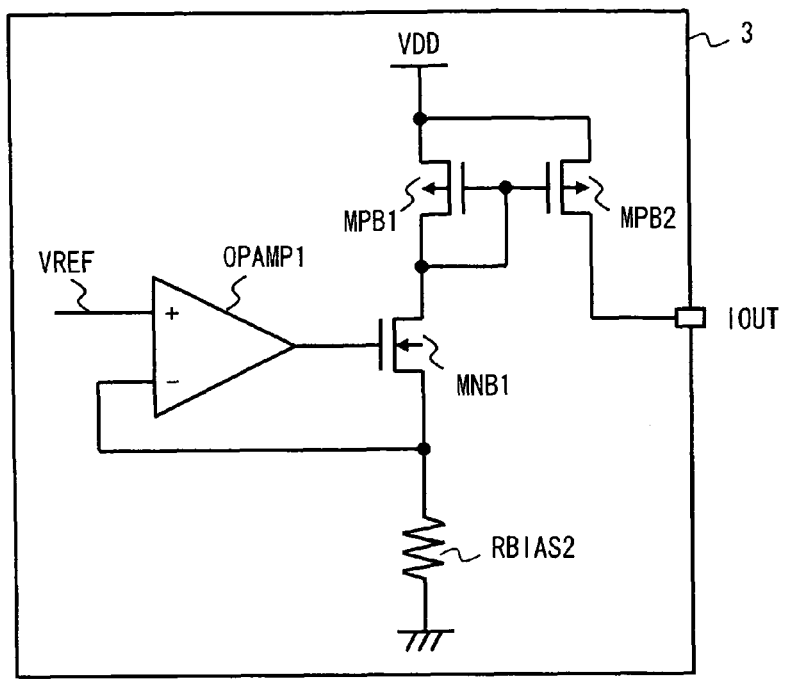
FIG. 2 is a circuit diagram showing a constant current source according to an exemplary embodiment of the present invention.

FIG. 2 shows a specific circuit example of the constant current source 3 which is connected to the power-supply variation correction circuit 1. The constant current source 3 shown in FIG. 2 receives a reference voltage VREF which is constant even when the power supply voltage VDD fluctuates. The circuit shown in FIG. 2 is a constant current source having a configuration of a V-I conversion circuit including an operational amplifier OPAMP1, a resistor RBIAS2, a transistor MNB1, a transistor MPB1, and a transistor MPB2.

The reference voltage VREF is supplied to a non-inverting input terminal of the operational amplifier OPAMP1. An output terminal of the operational amplifier OPAMP 1 is connected to the gate of the transistor MNB1 which is an N-channel MOS transistor. The source of the transistor MNB1 is connected to one terminal of the resistor RBIAS2 and an inverting input terminal of the operational amplifier OPAMP1. The reference potential VSS is applied to the other terminal of the resistor RBIAS2. The drain of the transistor MNB1 is connected to the drain and gate of the transistor MPB1, which is a P-channel MOS transistor, and to the gate of the transistor MPB2. The power supply voltage VDD is applied to the source of the transistor MPB1 and the source of the transistor MPB2. The drain of the transistor MPB2 is connected to the output terminal IOUT of the constant current source 3. The transistor MPB1 and the transistor MPB2 constitute a current mirror circuit.

In this case, the drain of the transistor MN13 of the power-supply variation correction circuit 1 is connected to the output terminal IOUT of the constant current source 3. An output current it of the constant current source 3 flows through the transistor MN13. A current corresponding to the reference current i1 flowing through the transistor MN13 flows through the transistor MN14, the transistor MN15, the transistor TrD1, and the transistor TrD3, which are current-mirror connected to the transistor MN13.

A current corresponding to an output current i2 of the transistor MN14 flows through the transistor MP12. A current corresponding to the current flowing through the transistor MP12 flows through the transistor MP11 which is current-mirror connected to the transistor MP12.

A current (reference current i9) corresponding to an output current i3 of the transistor MN15 flows through the transistor MP13. A current corresponding to the reference current i9 flowing through the transistor MP13 flows through the transistor TrD2 and the transistor TrD4 which are current-mirror connected.

A current i4 flowing through the transistor MN11 is generated by the resistor RBIAS1 and the transistor MN11. The output (drain) of the transistor MN12, which forms a current mirror circuit with the transistor MN11, is connected to the output (drain) of the transistor MP11, the input (drain) of the transistor MP13, and the output (drain) of the transistor MN15.

With the configuration of the power-supply variation correction circuit 1 as described above, the current flowing through the constant current transistor TrD1 and the constant current transistor TrD3 is kept constant even when the power supply voltage VDD fluctuates. Meanwhile, the current flowing through the constant current transistor TrD2 and the constant current transistor TrD4 varies depending on the current flowing through the transistor MP11, the transistor MN12, and the transistor MN15.

The operation of the constant current source 3 shown in FIG. 2 will now be described. Assuming that the voltage level of the reference voltage VREF is denoted by VREF, the resistance value of the resistor RBIAS2 is denoted by RBIAS2, and the current mirror ratio between the transistor MPB1 and the transistor MPB2 is denoted by n1, the current i1 flowing through the power-supply variation correction circuit 1 can be represented by the following expression (3).

$$i1 = (VREF/RBIAS2) \times n1 \qquad (3)$$

That is, the current i1 is constant even when the power supply voltage VDD fluctuates.

Next, the operation of the power-supply variation correction circuit 1 shown in FIG. 1 will be described. Assuming that the gate-source voltage of the transistor MN11 is denoted by Vgs11, the resistance value of the resistor RBIAS1 is denoted by RBIAS1, and the current mirror ratio between the transistor MN11 and the transistor MN12 is denoted by n2, an output current i5 of the variable current source 2 provided in the power-supply variation correction circuit 1 can be represented by the following expression (4).

$$i5 = (VDD - Vgs11)/RBIAS1 \times n2 \qquad (4)$$

That is, the current i5 increases when the power supply voltage VDD is high, while the current i5 decreases when the power supply voltage VDD is low.

A current i7 of the power-supply variation correction circuit 1 is obtained as follows. That is, the current i1 supplied from the constant current source 3 flows through the transistor MN13 as a reference current. The current i2 corresponding to the reference current i1 flows through the transistor MN14 which is current-mirror connected to the transistor MN13. A reference current corresponding to the current i2 flows through the transistor MP12. A current i6 corresponding to the reference current flows through the transistor MP11 which is current-mirror connected to the transistor MP12. A differential current between the current i6 and the output current i5 of the variable current source 2 corresponds to the current i7.

When the current i5 and the current i6 are adjusted to be equal to each other at the predetermined power supply voltage VDD, for example, the current i7 does not flow. In this case, the current i3 flowing through the transistor MN15 and the current i9 flowing through the transistor MP13 show the same current value. That is, a current i11 flowing through the constant current transistor TrD2 and a current i13 flowing through the constant current transistor TrD4 show a current value based only on the current i1 supplied from the constant current source 3. In other words, currents i10 and i11 flowing through the predriver 4c and currents i12 and i13 flowing through the predriver 4d show a constant current value.

Next, a description is given of the case where the power supply voltage VDD becomes higher than that applied when the current i5 and the current i6 are equal to each other. In this case, the current i5 increases, with the result that the current i5 is greater than the current i6. Thus, the current i7 flows from the drain of the transistor MP13 to the drain of the transistor MN12. Further, a description is given of the case where the power supply voltage VDD becomes lower than that applied when the current i5 and the current i6 are equal to each other. In this case, the current i5 decreases, with the result that the current i5 is less than the current i6. Thus, the current i7 flows from the drain of the transistor MP11 to the drain of the transistor MP13. In other words, the current i9 flowing through the transistor MP13 increases when the power supply voltage VDD is high, and decreases when the power supply voltage VDD is low.

The voltage of the output signal D+ will now be described. The output signal D− is similar to the output signal D+, so the description thereof is omitted. First, an output voltage Vdp (Rise) at the rise of the output signal D+ will be described. In this case, electric charges accumulated in the capacitor C1 are discharged by the drive current i10 flowing through the source of the transistor TrD1, thereby controlling the voltage Vdp (Rise) of the output signal D+. That is, the voltage Vdp (Rise) can be represented by the following expression (5).

$$Vdp(\text{Rise}) = (1/C1) \int i10 \, dt \quad (5)$$

where the drive current flowing through the source of the constant current transistor TrD1 is constant. Accordingly, the following expression (6) is obtained.

$$Vdp(\text{Rise}) = i10 \times t/C1 \quad (6)$$

Note that the constant current transistor TrD1 forms a current mirror circuit with the transistor MN13. For this reason, the drive current i10 flowing through the source of the constant current transistor TrD1 has a current value corresponding to the current i1 from the constant current source 3. Assuming, for ease of explanation, that the transistor MPB1 and the transistor MPB2 have a current mirror ratio of 1 and the transistor MN13 and the constant current transistor TrD1 have a current mirror ratio of n3, the following expression (7) is obtained.

$$i10 = (VREF/RBIAS2) \times n3 \quad (7)$$

Further, assuming, for ease of explanation, that n3=1, when the expression (7) is substituted into the expression (6), the voltage Vdp (Rise) can be represented by the following expression (8).

$$Vdp(\text{Rise}) = (VREF/RBIAS2) \times t/C1 \quad (8)$$

Next, a description is given of the output voltage Vdp (Fall) at the fall of the output signal D+. In this case, the drive current i11 flows through the source of the transistor TrD2 to cause electric charges to be stored in the capacitor C2, thereby controlling the voltage Vdp (Fall) of the output signal D+. That is, the voltage Vdp (Fall) can be represented by the following expression (9).

$$Vdp(\text{Fall}) = VDD - (1/C2) \int i11 \, dt \quad (9)$$

where the drive current flowing through the source of the constant current transistor TrD2 is constant. Accordingly, the following expression (10) is obtained.

$$Vdp(\text{Fall}) = VDD - i11 \times t/C2 \quad (10)$$

Thus, the drive current i10 obtained at the rise of the output signal D+ is controlled based only on the current supplied from the constant current source 3. Meanwhile, the drive current i11 obtained at the fall of the output signal D+ is controlled based on the current supplied from the constant current source 3 as well as the current supplied from the variable current source 2. For ease of explanation, it is assumed that the current mirror circuit formed of the transistors MPB1 and MPB2, the current mirror circuit formed of the transistors MN13, MN14, and MN15, the current mirror circuit formed of the transistors MP11 and MP12, the current mirror circuit formed of the transistors MN11 and MN12, and the current mirror circuit formed of the transistor MP13 and the constant current transistor TrD2 each have a current mirror ratio of 1. In this case, the differential current i7 can be represented by the following expression (11).

$$i7 = (VDD - Vgs11)/RBIAS1 - VREF/RBIAS2 \quad (11)$$

That is, the differential current i7 varies depending on the power supply voltage VDD.

When the power supply voltage VDD is high, for example, the differential current i7 flows from the drain of the transistor MP13 to the drain of the transistor MN12. Thus, the differential current i7 is added as a current flowing through the transistor MP13. Meanwhile, when the power supply voltage VDD is low, the differential current i7 flows from the drain of the transistor MP11 to the drain of the transistor MP13. Thus, the differential current i7 is subtracted as a current flowing through the transistor MP 13.

Furthermore, assuming that each current mirror circuit has a current mirror ratio of 1, the current i11 flowing through the constant current transistor TrD2 can be represented by the following expression (12).

$$i11 = (VDD - Vgs11)/RBIAS1 \quad (12)$$

When the expression (12) is substituted into the expression (10), the voltage Vdp (Fall) can be represented by the following expression (13).

$$Vdp(\text{Fall}) = VDD - ((VDD - Vgs11)/RBIAS1) \times t/C2 \quad (13)$$

That is, at the rise of the output signal D+ (D−), the voltage Vdp does not depend on the power supply voltage VDD, as is obvious from the expression (8). Meanwhile, at the fall of the output signal D+ (D−), the voltage Vdp depends on the power supply voltage VDD, as is obvious from the expression (13).

As described above, in the semiconductor integrated circuit according to an exemplary embodiment of the present invention, current paths for controlling the slew rate of the rise and fall of the output signal D+ (D−) are separated in a USB transceiver including a slew rate control circuit, for example. In the other words, one (e.g., rise) of the rise and fall of the output signal is controlled by the constant current, and the other (e.g., fall) of the rise and fall of the output signal is controlled by the current which varies depending on the power supply voltage VDD. Specifically, at the rise of the output signal D+ (D−), the slew rate thereof does not depend on the power supply voltage VDD. Meanwhile, at the fall of the output signal D+ (D−), the slew rate is controlled to increase when the power supply voltage VDD is high, and to decrease when the power supply voltage VDD is low. As a result, the variation in the crossover voltage of the differential output signals including the output signals D+ and D− can be suppressed even when the power supply voltage VDD fluctuates.

Figure 3:
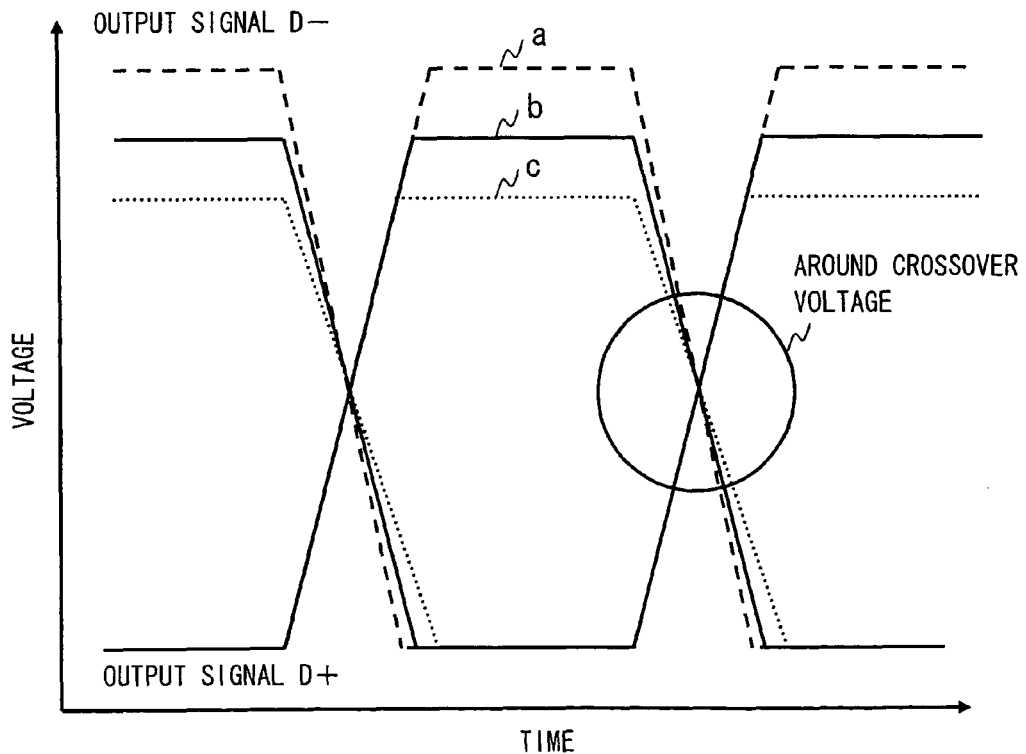
FIG. 3 is a waveform chart showing output signals of the semiconductor integrated circuit according to an exemplary embodiment of the present invention when a power supply voltage fluctuates.
Figure 4:
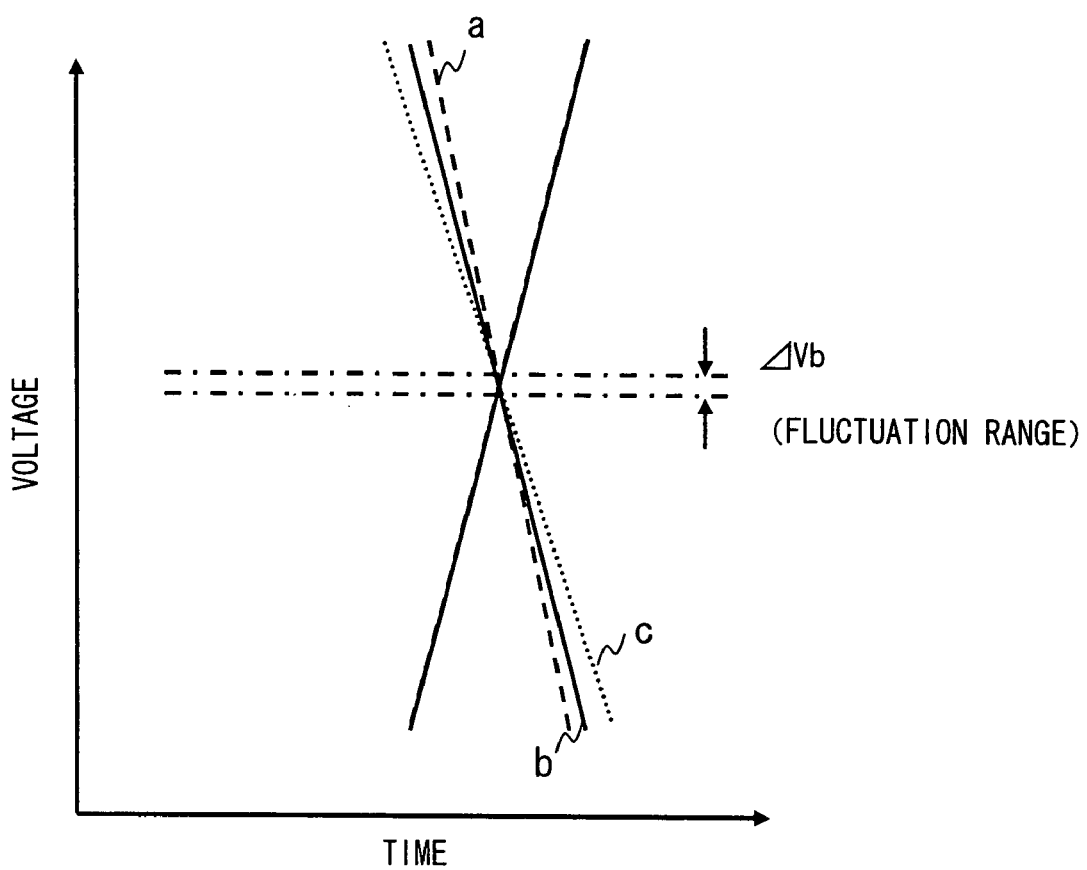
FIG. 4 is an enlarged graph showing a portion in the vicinity of a crossover voltage shown in FIG. 3.
Figure 5:
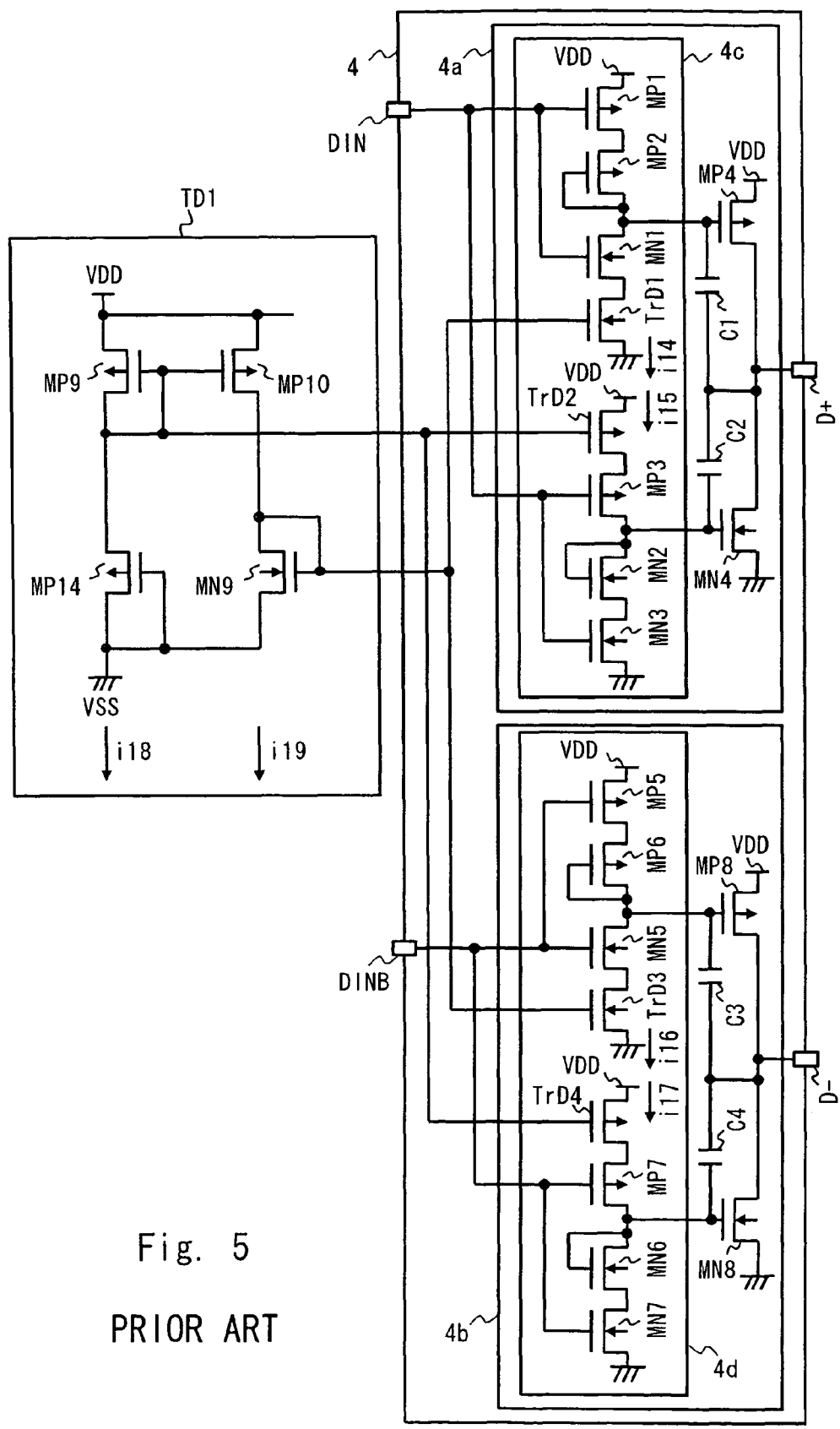
FIG. 5 is a circuit diagram showing a semiconductor integrated circuit of a related art.

FIG. 3 is a waveform chart showing the output signals D+ and D− of the semiconductor integrated circuit according to an exemplary embodiment of the present invention when the power supply voltage fluctuates. A waveform "b" is an output waveform obtained when the power supply voltage VDD is at a predetermined level. A waveform "a" is an output waveform obtained when the power supply voltage is higher than that in the case of the waveform "b". A waveform "c" is an output waveform obtained when the power supply voltage is lower than that in the case of the waveform "b". FIG. 4 is an enlarged graph showing a portion in the vicinity of the crossover voltage.

As shown in FIG. 3, at the rise of the output signal D+, the drive current of the predriver 4c does not depend on the power supply voltage VDD. For this reason, the signal change start time and the slew rate do not change even when the power supply voltage VDD fluctuates. That is, the waveforms "a", "b", and "c" match each other. Meanwhile, at the fall of the output signal D+, the drive current of the predriver 4c depends on the power supply voltage VDD. That is, the slew rate of the waveform "a" increases because of an increase in the drive current of the predriver 4c. The slew rate of the waveform "c" decreases because of a decrease in the drive current of the predriver 4c. The same is true in the case of the output signal D−. Therefore, the fluctuation range of the crossover voltage of the differential output signals can be suppressed even when the power supply voltage fluctuates.

As described above, the semiconductor integrated circuit according to an exemplary embodiment of the present invention is capable of suppressing the fluctuation range of the crossover voltage of the differential output signals even when the power supply voltage VDD fluctuates. For example, when communications are conducted at full speed and low speed in a USB transceiver or the like, a variation in crossover voltage of differential output signals can be reduced.

Note that the present invention is not limited to the exemplary embodiments described above, and can be modified in various ways without departing from the scope of the present invention. For example, while the description has been made of an example where the current mirror circuits provided in the power-supply variation correction circuit 1 and the constant current transistors TrD1 to TrD4 are MOS transistors, the circuit configuration is not limited thereto. A circuit configuration in which these transistors are bipolar transistors, for example, may also be employed as needed.

Further, while the description has been made of the case where the power supply voltage VDD fluctuates in the above exemplary embodiment, the circuit configuration is not limited thereto. A circuit configuration in which the power supply voltage VDD has a predetermined reference potential as a high-potential-side power supply and the reference potential VSS fluctuates as a low-potential-side power supply can also be employed as needed. In this case, the slew rate of the rise of each of the output signals D+ and D− is controlled in accordance with a variation of the low-potential-side power supply. Meanwhile, the slew rate of the fall of each of the output signals D+ and D− is controlled to be independent of the variation of the low-potential-side power supply.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
a differential driver that is disposed between a first power supply and a second power supply and drives differential input signals to generate differential output signals; and
a control signal generation circuit that generates a first control signal for controlling a voltage level of each of the differential output signals,
wherein when each of a pair of output signals forming the differential output signals is changed from a voltage level corresponding to the first power supply to a voltage level corresponding to the second power supply, an amount of change in the voltage level of the corresponding output signal is controlled based on the first power supply, and
wherein the control signal generation circuit controls a drive current for controlling one of a rising edge and a falling edge of each of the pair of output signals to be set as a constant current, and controls a drive current for controlling the other of a rising edge and a falling edge of each of the pair of output signals to be set as a variable current.

2. The semiconductor integrated circuit according to claim 1, wherein
the differential driver comprises:
a first predriver circuit that generates first and second predrive signals based on one of the differential input signals;
a second predriver circuit that generates third and fourth predrive signals based on the other of the differential input signals;
a first output circuit that outputs one of the differential output signals from an output terminal and comprises a first inverter, the first inverter including: a first transistor which is disposed between the second power supply and the output terminal, and turning on/off of which is controlled based on the first predrive signal; and a second transistor which is disposed between the first power supply and the output terminal, and turning on/off of which is controlled based on the second predrive signal; and
a second output circuit that outputs the other of the differential output signals from the output terminal and comprises a second inverter, the second inverter including: a third transistor which is disposed between the second power supply and the output terminal, and turning on/off of which is controlled based on the third predrive signal; and a fourth transistor which is disposed between the first power supply and the output terminal, and turning on/off of which is controlled based on the fourth predrive signal, the first predriver circuit controls a voltage level of the first predrive signal based on the first control signal, and the second predriver circuit controls a voltage level of the third predrive signal based on the first control signal.

3. The semiconductor integrated circuit according to claim 2, wherein the first predriver circuit generates the second predrive signal without controlling the voltage level based on the first control signal, and the second predriver circuit generates the fourth predrive signal without controlling the voltage level based on the first control signal.

4. The semiconductor integrated circuit according to claim 2, wherein the first predriver circuit comprises:
a third inverter that inverts one of the differential signals to generate the first predrive signal;
a fourth inverter that inverts one of the differential signals to generate the second predrive signal; and
a fifth transistor disposed between the first power supply and the third inverter, a current flowing through the fifth transistor being controlled based on the first control signal, and the second predriver circuit comprises:
a fifth inverter that inverts the other of the differential signals to generate the third predrive signal; and
a sixth inverter that inverts the other of the differential signals to generate the fourth predrive signal; and
a sixth transistor disposed between the first power supply and the fifth inverter, a current flowing through the sixth transistor being controlled based on the first control signal.

5. The semiconductor integrated circuit according to claim 2, wherein the control signal generation circuit further generates a second control signal having a predetermined current value, the first predriver circuit further comprises a seventh transistor disposed between the second power supply and the fourth inverter, a current flowing through the seventh transistor being controlled based on the second control signal, and the second predriver circuit further comprises an eighth transistor disposed between the second power supply and the sixth inverter, a current flowing through the eighth transistor being controlled based on the second control signal.

6. The semiconductor integrated circuit according to claim 2, wherein the first output circuit further comprises:
a first capacitive element connected between a gate and a drain of the first transistor; and
a second capacitive element connected between a gate and a drain of the second transistor, and the second output circuit further comprises:
a third capacitive element connected between a gate and a drain of the third transistor; and
a fourth capacitive element connected between a gate and a drain of the fourth transistor.

7. The semiconductor integrated circuit according to claim 2, wherein the first power supply is a high-potential-side power supply, and the second power supply is a low-potential-side power supply.

8. The semiconductor integrated circuit according to claim 7, wherein the first and third transistors are N-channel MOS transistors, and the second and fourth transistors are P-channel MOS transistors.

9. The semiconductor integrated circuit according to claim 4, wherein the first power supply is a high-potential-side power supply, the second power supply is a low-potential-side power supply, and the fifth and sixth transistors are P-channel MOS transistors.

10. The semiconductor integrated circuit according to claim 9, wherein the seventh and eighth transistors are N-channel MOS transistors.

11. The semiconductor integrated circuit according to claim 2, wherein the first power supply is a low-potential-side power supply, and the second power supply is a high-potential-side power supply.

12. The semiconductor integrated circuit according to claim 11, wherein the first and third transistors are P-channel MOS transistors, and the second and fourth transistors are N-channel MOS transistors.

13. The semiconductor integrated circuit according to claim 4, wherein the first power supply is a low-potential-side power supply, the second power supply is a high-potential-side power supply, and the fifth and sixth transistors are N-channel MOS transistors.

14. The semiconductor integrated circuit according to claim 13, wherein the seventh and eighth transistors are P-channel MOS transistors.

15. The semiconductor integrated circuit according to claim 1, wherein:

the first power supply is a high-potential-side power supply, the second power supply is a low-potential-side power supply, and when a voltage level of the first power supply is of a high state, a current obtained by adding a current corresponding to a variation in power supply voltage to a constant current is provided as the variable current.

16. The semiconductor integrated circuit according to claim 1, wherein when a voltage of the first power supply is of a low state compared to the high state, a current obtained by subtracting a current corresponding to a variation in power supply voltage from the constant current is provided as the variable current, such that the drive current for controlling a falling edge of each of the differential output signals is controlled.

17. The semiconductor integrated circuit according to claim 1, wherein a control signal generation circuit comprises a constant current source and a variable current source, and wherein the drive current obtained at one of a rising edge and a falling edge of a first of the pair of output signals is controlled based only on a current supplied from the constant current source, while the drive current obtained at the other of a rising edge and a falling edge of a second of the pair of output signals is controlled based on a current supplied from the constant current source and a current supplied from the variable current source.

18. A semiconductor integrated circuit comprising:

a differential driver receiving a first power supply and a second power supply and driving differential input signals to generate differential output signals; and a control signal generation circuit that generates a first control signal for controlling a voltage level of each of the differential output signals, wherein the control signal generation circuit controlling drive currents, for controlling one of a rising edge and a falling edge of each of the differential output signals, is set as a constant current and a drive current for controlling the other of a rising edge and a falling edge of each of the differential output signals is set as a variable current.

19. The semiconductor integrated circuit according to claim 18, wherein the control signal generation circuit comprises a constant current source and a variable current source, and wherein the drive current obtained at one of a rising edge and a falling edge of a first of the pair of output signals is controlled based on a current supplied from the constant current source, while the drive current obtained at the other of a rising edge and a falling edge of a second of the pair of output signals is controlled based on a current supplied from the constant current source and a current supplied from the variable current source.

* * * * *